(12) United States Patent
Hayakawa

(10) Patent No.: US 8,957,665 B2
(45) Date of Patent: Feb. 17, 2015

(54) VOLTAGE MEASUREMENT APPARATUS INCLUDING SWITCH CIRCUIT

(75) Inventor: Takahito Hayakawa, Kariya (JP)

(73) Assignee: DENSO CORPORATION, Kariya (JP)

( * ) Notice: Subject to any disclaimer, the term of this patent is extended or adjusted under 35 U.S.C. 154(b) by 562 days.

(21) Appl. No.: 13/274,648

(22) Filed: Oct. 17, 2011

(65) Prior Publication Data

US 2012/0133355 A1     May 31, 2012

(30) Foreign Application Priority Data

Nov. 25, 2010    (JP) ................................. 2010-262317

(51) Int. Cl.
     *G01R 19/00*      (2006.01)
     *G01R 31/08*      (2006.01)
     *G01R 19/165*     (2006.01)
     *G01R 31/36*      (2006.01)

(52) U.S. Cl.
     CPC ...... *G01R 19/16542* (2013.01); *G01R 31/3658* (2013.01)
     USPC ....................................... 324/76.11; 324/522

(58) Field of Classification Search
     CPC ............. G01R 31/3658; G01R 31/362; G01R 19/16542; G01R 19/2503; G01R 31/3606; G01R 31/3679
     See application file for complete search history.

(56) References Cited

U.S. PATENT DOCUMENTS

| | | | |
|---|---|---|---|
| 5,369,541 A | * | 11/1994 | Normet ........................... 361/85 |
| 5,712,568 A | * | 1/1998 | Flohr et al. .................... 324/434 |
| 6,104,164 A | | 8/2000 | Iino et al. |
| 8,242,770 B2 | | 8/2012 | Tanaka et al. |
| 2006/0012336 A1 | | 1/2006 | Fujita |
| 2009/0058505 A1 | | 3/2009 | Yoshio |
| 2012/0025768 A1 | * | 2/2012 | Nakano et al. ................ 320/116 |

FOREIGN PATENT DOCUMENTS

| | | |
|---|---|---|
| CN | 101728852 A | 6/2010 |
| JP | A-2007-295209 | 11/2007 |
| JP | 4281036 B2 | 3/2009 |

OTHER PUBLICATIONS

Office Action dated Oct. 2, 2012 mailed in corresponding JP application No. 2010-262317.
Office Action mailed Dec. 11, 2013 issued in corresponding CN patent application No. 201110382013.6 (and English translation).
Office Action dated Dec. 4, 2012 mailed in corresponding JP application No. 2010-262317.

* cited by examiner

*Primary Examiner* — Vinh Nguyen
(74) *Attorney, Agent, or Firm* — Posz Law Group, PLC

(57) ABSTRACT

A resistor element that is coupled between each of voltage measurement points of a measurement object and a voltage measurement circuit is further coupled to a path of a constant current between a power supply side constant current circuit and a ground side constant current circuit. By controlling the operation of the power supply side constant current circuit and the ground side constant current circuit with a control circuit, the control circuit switches the switch circuit on and off to prevent a voltage drop due to an electric current that turns on the switch circuit.

12 Claims, 13 Drawing Sheets

VOLTAGE MEASUREMENT APPARATUS INCLUDING SWITCH CIRCUIT

CROSS REFERENCE TO RELATED APPLICATION

The present application is based on and claims the benefit of priority of Japanese Patent Application No. 2010-262317, filed on Nov. 25, 2010, the disclosure of which is incorporated herein by reference.

TECHNICAL FIELD

This invention generally relates to a voltage measurement apparatus for detecting an electric potential of multiple voltage measurement points by using a voltage measurement circuit.

BACKGROUND

Conventionally, an assembled battery having multiple unit cells coupled in series may have a switch circuit for the electric potential measurement of each of the multiple unit cells by using a single voltage measurement circuit. That is, the switch circuit having a metal-oxide semiconductor field effect transistor (MOSFET) switches a connection between the voltage measurement circuit and each of the unit cell terminals in the multiple unit cells. According to Japanese Patent document 2006-53120 (JP '120) and Japanese Patent 4,450,817 (JP '817), in order to achieve a normal operation of the switch circuit even in a situation where the measurement voltage is higher than a gate-source withstand voltage of the MOSFET, the switch circuit is configured to have two MOSFETs coupled in series for having an electric current directed to a resistor element coupled between the gate and the source of those MOSFETs to turn on the switch circuit.

However, according to JP '120 and JP '817, a unit cell is used as a power supply of the electric current to be directed to the above resistor element. Therefore, a voltage drop occurs by an on-resistance of the MOSFET. Further, a voltage drop also occurs in a resistor in a filter circuit that is used for noise removal, when each of the unit cells has the filter circuit. As a result, the voltage drops may affect the measurement result of the voltage measurement circuit.

SUMMARY

In an aspect of the present disclosure, the voltage measurement apparatus has a current carrying part of a switch circuit which is coupled between each of the voltage measurement points and the voltage measurement circuit, and the current carrying part is coupled to an open path that allows a constant current to flow between a power supply side constant current circuit and a ground side constant current circuit. Further, a control circuit controls switching ON/OFF of the switch circuit by controlling operation of the power supply side constant current circuit and the ground side constant current circuit. Therefore, by preventing an electric current, which is intended to flow to the current carrying part of the switch circuit, from flowing from a voltage measurement object through the voltage measurement point, voltage measurement by the voltage measurement circuit is stably performed. In other words, due to the prevention of a voltage drop by a resistance factor of the open path, the voltage measurement is stably and accurately performed.

According to the voltage measurement apparatus of the present disclosure, the switch circuit may include a series connection of two same channel type MOSFETs with oppositely-arranged parasitic diodes coupled thereto and a resistor element coupled between a gate and a source of the MOSFET that serves as the current carrying part. In such configuration, the electric current is prevented from flowing through the two parasitic diodes, thereby causing a voltage difference between the gate and the source of the MOSFETs to allow a conduction of the switch circuit.

According to the voltage measurement apparatus of the present disclosure, the MOSFETs are either of a P channel MOSFET or an N channel MOSFET. Therefore, the switch circuit is conducted by causing a terminal voltage of the resistor element to lower a gate voltage of the MOSFET to be lower than a source voltage, or to raise the gate voltage to be higher than the source voltage.

According to the voltage measurement apparatus of the present disclosure, the two MOSFETs are respectively configured in a common source connection or common drain connection, thereby having the parasitic diodes to be arranged in opposite directions with each other.

According to the voltage measurement apparatus of the present disclosure, the voltage measurement object is a terminal voltage of the unit cells of the assembled battery. In other words, while the conventional technique consumes an electric power of the unit cell which currently is a measurement object during the conduction of the switch circuit (i.e., during a switch-ON period of the switch circuit), the voltage measurement apparatus of the present disclosure is capable of performing the voltage measurement of the unit cell without consuming the electric power. Therefore, the variation of the voltages caused by the conventional technique among the unit cells is prevented.

According to the voltage measurement apparatus of the present disclosure, only one voltage measurement circuit may be disposed for the voltage measurement of multiple voltage measurement points. Therefore, by switching ON/OFF of each of the switch circuits, the voltage of each of the multiple voltage measurement points is measured.

According to the voltage measurement apparatus of the present disclosure, a high potential switch circuit may include the P channel MOSFET with its source coupled to the voltage measurement point and with its drain coupled to the voltage measurement circuit and a resistor element coupled between the voltage measurement point and a gate of the P channel MOSFET, and a ground side constant current circuit, which has a constant current path, coupled to the gate, and switching ON/OFF of the high potential switch circuit is controlled by the control circuit by controlling the operation of the ground side constant current circuit. In other words, for a voltage measurement point that has the highest electric potential among the multiple voltage measurement points, backward flow of the electric current flowing reversely from the voltage measurement circuit toward the voltage measurement point is prevented when the high potential switch circuit is conducted. Therefore, the high potential switch circuit may be formed by using one P channel MOSFET.

According to the voltage measurement apparatus of the present disclosure, a low potential switch circuit may include the N channel MOSFET with its source coupled to the voltage measurement point and with its drain coupled to the voltage measurement circuit and a resistor element with one end coupled to both of a constant current path of the power supply side constant current circuit and a gate of the N channel MOSFET, and with the other end coupled to the voltage measurement point. Further, switching ON/OFF of the low potential switch circuit is controlled by the control circuit by controlling the operation of the power supply side constant current circuit. In other words, for a voltage measurement point that has a voltage lower than a ground voltage and has the lowest voltage among the multiple voltage measurement points, backward flow of the electric current flowing reversely from the voltage measurement point toward the voltage measurement circuit is prevented when the low potential switch circuit is conducted. Therefore, the low potential switch circuit is formed by using one N channel MOSFET.

According to the voltage measurement apparatus of the present disclosure, the power supply side constant current circuit and the ground side constant current circuit may respectively be formed as a current mirror circuit, and the control circuit may be formed as a circuit that provides the constant current for the operation of the power supply side constant current circuit and the ground side constant current circuit. In such configuration, because a mirror current is directed to flow to the constant current path of the current mirror circuit, due to the supply of the constant current under control of the control circuit to enable the operation of the power supply side constant current circuit and the ground side constant current circuit, the current carrying part of the switch circuit has the electric current flowing therethrough.

According to the voltage measurement apparatus of the present disclosure, the ground side constant current circuit may be formed as a current mirror circuit, the control circuit provides the constant current to a control current path of the current mirror circuit. Further, the power supply side constant current circuit cooperates with the control circuit to provide a constant current to a mirror current path of the current mirror circuit, and the amount of the constant current provided by the power supply side constant current circuit is same as the amount of the constant current provided by the control circuit. In such configuration, because the control circuit and the power supply side constant current circuit cooperatively provide the electric current for the operation of the current mirror circuit on a ground side, the current carrying part of the switch circuit has the electric current flowing therethrough.

BRIEF DESCRIPTION OF THE DRAWINGS

Objects, features, and advantages of the present disclosure will become more apparent from the following detailed description made with reference to the accompanying drawings, in which.

DETAILED DESCRIPTION

First Embodiment

Figure 1:
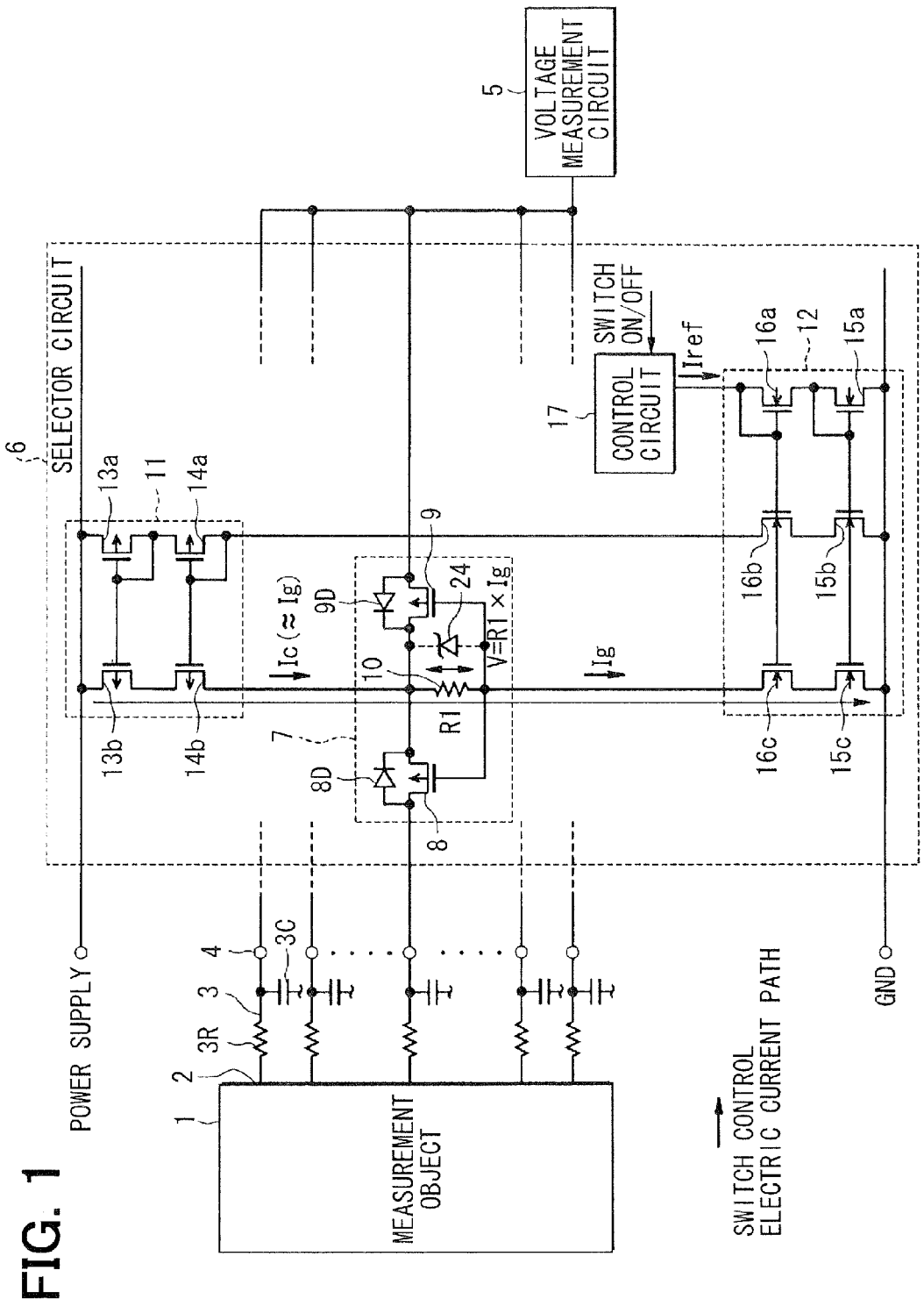
FIG. 1 is a schematic diagram of a voltage measurement apparatus in a first embodiment of the present disclosure.
Figure 2:
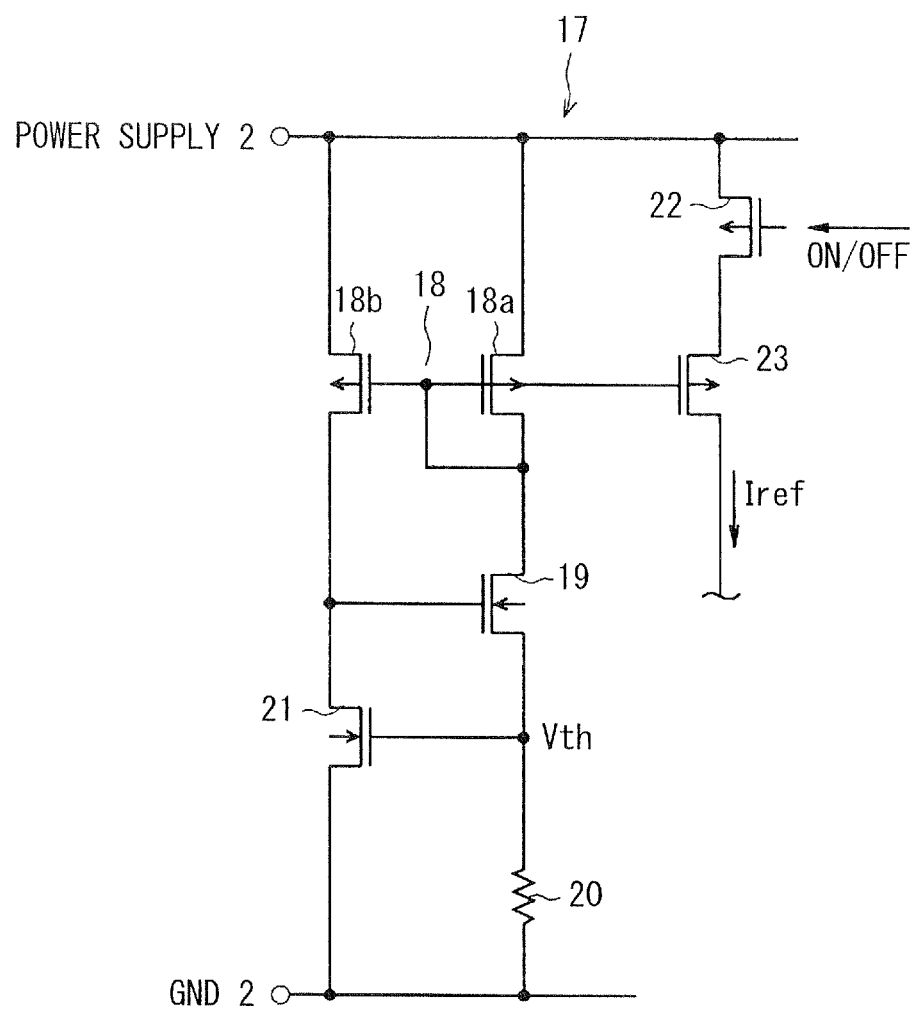
FIG. 2 is a detail of a control circuit in the first embodiment.

With reference to FIGS. 1 and 2, a voltage measurement apparatus that measures an electrical voltage (i.e., an electrical potential) of a measurement object 1 that may have multiple parts is shown. The measurement object 1 may be an assembled battery that has multiple cells coupled in series. In the assembled battery, there are multiple voltage measurement points 2 respectively having different voltages. Each of the voltage measurement points 2 is coupled to a measurement terminal 4 by way of a low pass filter 3. The low pass filter 3 may be comprised of a resistor element 3R and a capacitor 3C. Further, the capacitor 3C may be coupled to a reference voltage suitable for a formation of the voltage measurement by using the measurement terminal 4.

A selector circuit 6 is coupled between a voltage measurement circuit 5 and the measurement terminal 4, which corresponds to each of the multiple voltage measurement points 2. The selector circuit 6 includes a plurality of switch circuits 7, where one end of each of the switch circuits 7 is coupled to a corresponding measurement terminal 4, and the other end of each of the switch circuits 7 is coupled to a common (i.e., same) input terminal of the voltage measurement circuit 5. The switch circuit 7 may include two P channel MOSFETs 8, 9 and a current carrying part that may be a resistor element 10. The resistor element 10 is coupled between the source and the gate of the two MOSFETs 8,9. The two P channel MOSFETs 8, 9 are coupled with a parasitic diode 8D, 9D, respectively, where the diodes 8D, 9D are arranged to have a common cathode connection, such that the diodes 8D, 9D are in opposite directions with each other.

The selector circuit 6 also includes a power supply side constant current circuit 11 and a ground side constant current circuit 12. The power supply side constant current circuit 11 is coupled to a power supply, and the ground side constant current circuit 12 is coupled to a ground. Within the selector circuit 6, the power supply side constant current circuit 11 and the ground side constant current circuit 12 are coupled to each of the switch circuits 7. The power supply side constant current circuit 11 may be formed by four P channel MOSFETs, which is designated as a cascode-type current mirror circuit having a series connection of (a) a mirror pair of P channel MOSFETs 13a, 13b and (b) a mirror pair of P channel MOSFETs 14a and 14b. The gate of each of the P channel MOSFETs 13a and 13b is coupled to the drain of the P channel MOSFET 13a, and the gate of each of the P channel MOSFETs 14a and 14b is coupled to the drain of the P channel MOSFET 14a.

The ground side constant current circuit 12 may be formed by six N channel MOSFETs, as a cascode-type current mirror circuit having a series connection of (a) a mirror pair of N channel MOSFETs 15a, 15b, 15c and (b) a mirror pair of N channel MOSFETs 16a, 16b, 16c. The gate of each of the N channel MOSFETs 15a, 15b, 15c is coupled to the drain of the N channel MOSFET 15a, and the gate of each of the N channel MOSFETs 16a, 16b, 16c is coupled to the drain of the N channel MOSFET 16a.

The drain of the N channel MOSFET 16b is coupled to the drain of the P channel MOSFET 14a, and the drain of the N channel MOSFET 16c is coupled to the gate of each of the P channel MOSFETs 8, 9, and the drain of the P channel MOSFET 14b is coupled to the source of each of the P channel MOSFETs 8, 9. The resistor element 10 of the switch circuit 7 is coupled to a mirror current path or a constant current path (FIG. 1, a switch control electric current path), which is a path between the drain of the P channel MOSFET 14b and the drain of the N channel MOSFET 16c.

A control circuit 17 operates the ground side constant current circuit 12 and the power supply side constant current circuit 11 by providing a constant current Iref to the N channel MOSFETs 16a, 15a of the ground side constant current circuit 12. FIG. 2 shows a detailed configuration of the control circuit 17. The control circuit 17 serves as a self-bias type constant current circuit that is formed as a combination of an electric current supply section and a current mirror circuit 18. The control circuit 17 generates a mirror current Iref that is approximately equal to a constant current defined by the electric current supply section.

The current mirror circuit 18 may be formed by two P channel MOSFETs 18a, 18b that are coupled to a power supply (2). The drain of the P channel MOSFET 18a, 18b is coupled to a ground GND (2) by way of the electric current supply section. Specifically, the drain of the P channel MOSFET 18a is coupled to the GND (2) through an N channel MOSFET 19 and a resistor element 20, and the drain of the P channel MOSFET 18b is coupled to the ground GND (2) through an N channel MOSFET 21. The gate of each of the P channel MOSFETs 18a, 18b is coupled to the drain of the P channel MOSFET 18a.

The electric current supply section of the control circuit 17 may be formed by the N channel MOSFETs 19, 21 and the resistor element 20. Where the gate of the N channel MOSFET 19 is coupled to the drain of the P channel MOSFET 18b, and the gate of the N channel MOSFET 21 is coupled to the source of the N channel MOSFET 19.

The control circuit 17 may also have a series circuit of two P channel MOSFETs 22 and 23 that are coupled to the power supply (2). The gate of the P channel MOSFET 23 is coupled to the gates of the P channel MOSFETs 18a, 18b of the current mirror circuit 18. The drain of the P channel MOSFET 23 is coupled to the drain of the N channel MOSFET 16a (not shown), which transmits the mirror current Iref to the ground side constant current circuit 12. The supply of the current Iref is controlled by an ON/OFF signal provided through the gate of the P channel MOSFET 22.

The effects of the present embodiment is explained in the following. In the control circuit 17, when the ON/OFF signal provided for the gate of the P channel MOSFET 22 is a high level that is substantially the same level as the power supply (2), the constant current Iref is not supplied to the ground side constant current circuit 12, and the operation of both of the ground side constant current circuit 12 and the power supply side current mirror circuit 11 is stopped. Therefore, the electric current does not flow to the resistor element 10 in the switch circuit 7, and the P channel MOSFETs 8, 9 are turned off, thereby prohibiting the electric current from flowing between the measurement terminal 4 and the voltage measurement circuit 5.

On the other hand, when the ON/OFF signal provided to the gate of the P channel MOSFET 22 is a low level that is lower than the level of the power supply (2) by an amount greater than the threshold voltage, the constant current Iref is supplied to the ground side constant current circuit 12, and the ground side constant current circuit 12 and the power supply side constant current circuit 11 are operated. Therefore, a mirror current Ig of the constant current Iref flows through the resistor element 10 of the switch circuit 7. When the resistance value of the resistor element 10 is designated as R1, a gate electric potential of the P channel MOSFETs 8, 9 falls from a source electric potential by an amount (R1×Ig), and the P channel MOSFETs 8, 9 are turned on when the amount of voltage fall exceeds the threshold voltage. In such manner, the electric current flows between the measurement terminal 4 and the voltage measurement circuit 5 through the switch circuit 7.

Furthermore, a gate-source voltage of the P channel MOSFETs 8, 9 can be clamped by a Zener voltage Vz of a Zener diode 24 when the Zener diode 24 is arranged in parallel with the resistor element 10 as shown in a broken line in FIG. 1. Then, the voltage measurement circuit 5 measures an electric potential of the measurement terminal 4 corresponding to the switch circuit 7 that is turned on by the control circuit 17, with reference to a reference potential of its own (e.g., a ground potential).

As described above in the present embodiment, the resistor element 10 of the switch circuit 7, which is coupled to each of the voltage measurement points 2 of the measurement object 1 and the voltage measurement circuit 5, is coupled to an open path of a constant current (i.e., a mirror current) flowing between the power supply side constant current circuit 11 and the ground side constant current circuit 12. The switching ON/OFF of the switch circuit 7 is controlled by the control circuit 17 that controls the operation of both of the power supply side constant current circuit 11 and the ground side constant current circuit 12. Therefore, by preventing an electric current, which is intended to flow to the resistor element 10 in the switch circuit 7, from flowing from the measurement object 1 through the voltage measurement point 2, voltage measurement by the voltage measurement circuit 5 is stably performed. In other words, due to the prevention of a voltage drop by a resistance factor of the open path, the voltage measurement is stably and accurately performed.

Further, because the switch circuit 7 is configured to have a series circuit of the two P channel MOSFETs 8, 9, with two parasitic diode 8D, 9D, respectively, where the diodes 8D, 9D are arranged to have a common cathode connection, such that the diodes 8D, 9D are in opposite directions with each other, and the resistor element 10 coupled between the source and the gate of the two MOSFETs 8, 9, the electric current flowing through the parasitic diodes 8D, 9D is prevented, and the conduction of the switch circuit 7 is enabled by having an electric potential difference between the gate and the source generated by the electric current in the resistor element 10.

Further, different from the conventional technique, the electric current generated for the conduction of the switch circuit 7 does not flow through the P channel MOSFETs 8, 9, resulting in no voltage drop due to an on-resistance of the resistor element 3R and the P channel MOSFET 8, 9, thereby enabling a more stable and accurate voltage measurement. Further, due to the prevention of flow of the above-described electric current and the prevention of consumption of the electric power of the voltage measurement point 2 caused by such electric current, variation of the voltage among the multiple voltage measurement points 2 caused by such electric power consumption is prevented.

Furthermore, the electric potential of each of the multiple voltage measurement points 2 is measured by only one voltage measurement circuit 5 by switching ON/OFF of each of the switch circuits 7. In addition, the power supply side constant current circuit 11 and the ground side constant current circuit 12 are formed as a current mirror circuit, and the control circuit 17 is formed as a circuit that provides the constant current Iref to operate both of the power supply side constant current circuit 11 and the ground side constant current circuit 12. Therefore, by providing the constant current Iref the control circuit 17 enables the operation of both of the power supply side constant current circuit 11 and the ground side constant current circuit 12, thereby enabling a flow of the mirror current to the constant current path of the current mirror circuit for the purpose of flowing an electric current to the resistor element 10 in the switch circuit 7.

Second Embodiment

Figure 3:
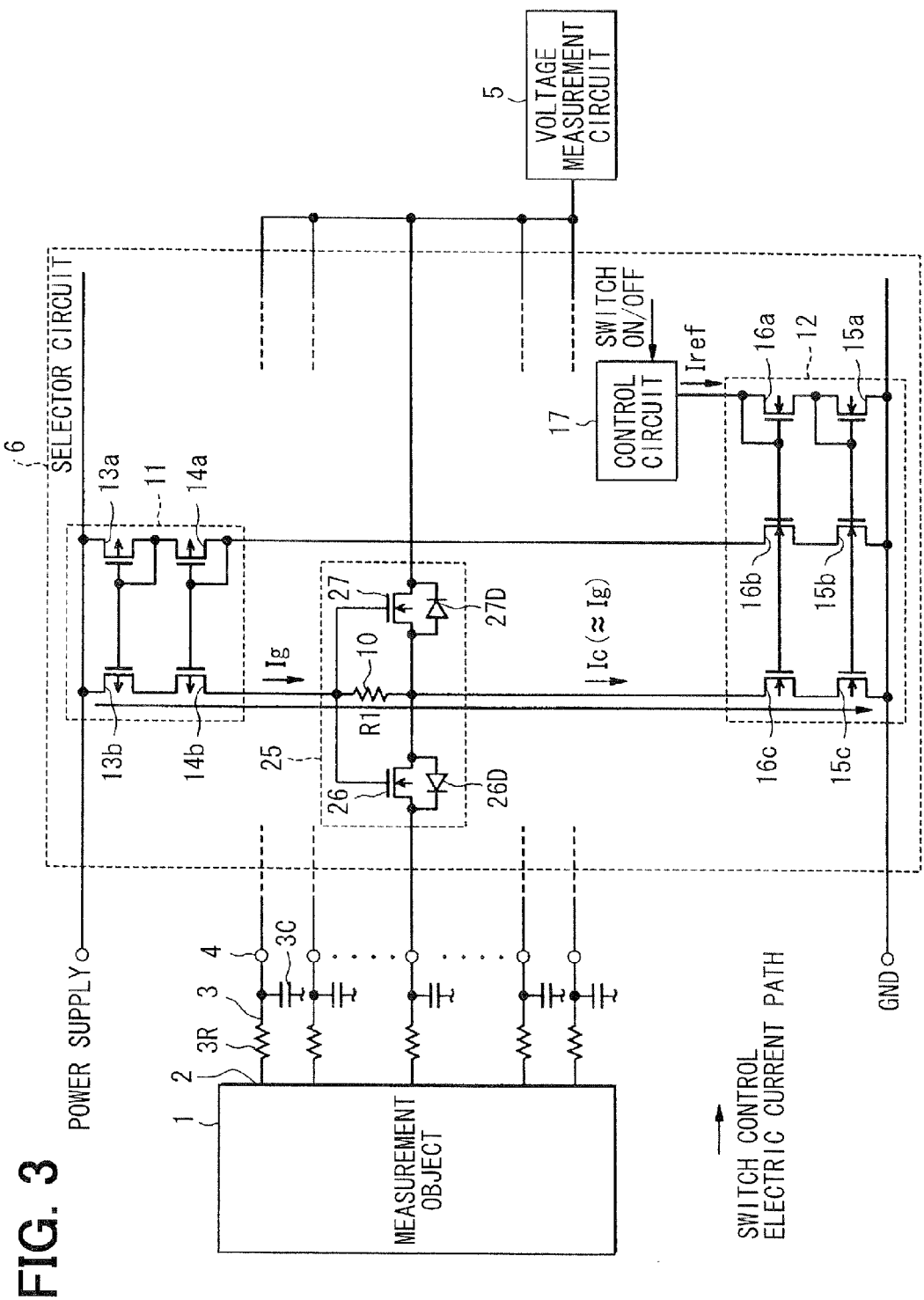
FIG. 3 is a schematic diagram of a voltage measurement apparatus in a second embodiment of the present disclosure.

The second embodiment is shown in FIG. 3, in which like parts have like numbers as the first embodiment, and the difference from the first embodiment is described in the following. In the second embodiment, a switch circuit 25 replaces the switch circuit 7. The switch circuit 27 includes two N channel MOSFETs 26, 27 that are arranged to have a common source connection and common gate connection, such that the N channel MOSFETs 26, 27 respectively have its parasitic diodes 26D, 27D arranged in opposite directions with each other. The gate of each of the N channel MOSFETs 26, 27 is coupled to the drain of the P channel MOSFET 14b, and the source of each of the N channel MOSFETs 26, 27 is coupled to the drain of the N channel MOSFET 16c.

In the above configuration, similar to the first embodiment, when the constant current Iref is provided to the ground side constant current circuit 12 by the control circuit 17, a mirror current Ic (≈Ig) flows to the resistor element 10, and a gate potential of the N channel MOSFETs 26, 27 is raised by (R1×Ig) from a source potential, the switch circuit 25 is turned on (i.e. is conducted) when such potential difference exceeds the threshold voltage. Therefore, the same advantageous effects as the first embodiment are achieved.

Third Embodiment

Figure 4:
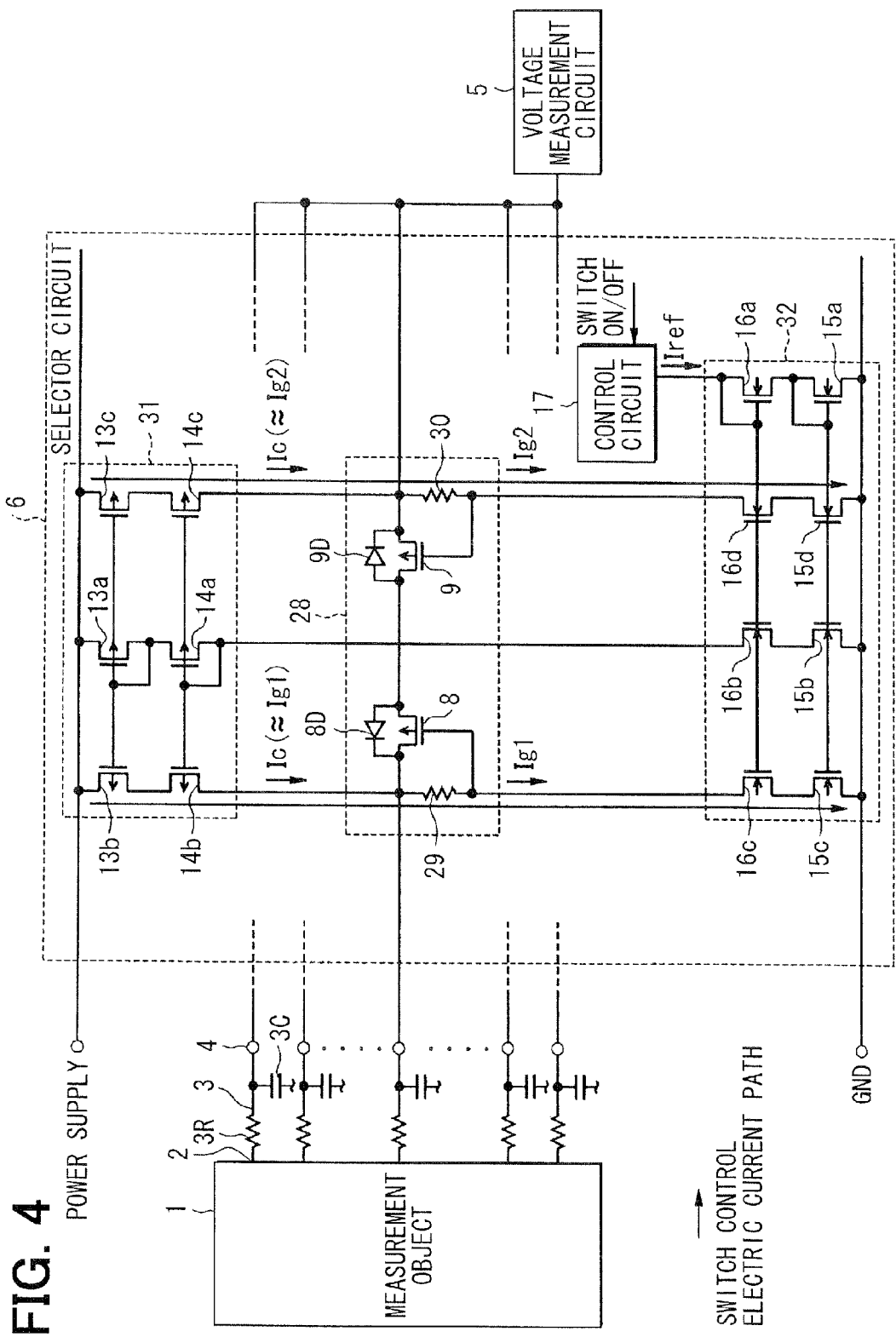
FIG. 4 is a schematic diagram of a voltage measurement apparatus in a third embodiment of the present disclosure.

The third embodiment is shown in FIG. 4, in which like parts have like numbers as the first embodiment, and the difference from the first embodiment is described in the following. In the third embodiment, a switch circuit 28, a power supply side constant current circuit 31, and a ground side constant current circuit 32 respectively replace the switch circuit 17, the power supply side constant current circuit 11, and the ground side constant current circuit 12.

The switch circuit 28 is configured to have the two P channel MOSFETs 8, 9 in a connection direction reversed from the first embodiment such that the P channel MOSFETs 8, 9 share a common drain. Additionally, the parasitic diodes 8D, 9D have a common anode connection, such that the diodes 8D, 9D are coupled in opposite directions with each other. The current carrying part of the switch circuit 28 is provided as two resistor elements 29, 30. The resistor 29, 30 are respectively coupled between the source and the gate of P channel MOSFETs 8, 9, and thus resulting in a different configuration of the power supply side constant current circuit 31 and the ground side constant current circuit 32.

In the third embodiment, in addition to the P channel MOSFET 13a, 13b, 14a, and 14b, the power supply side constant current circuit 31 also includes a P channel MOSFET 13c and 14c. Where the P channel MOSFET 13c forms a mirror pair with the P channel MOSFETs 13a, 13b, and the P channel MOSFET 14c forms a mirror pair with the P channel MOSFET 14a, 14b. In addition to the N channel MOSFET 15a to 15c, 16a to 16c, the ground side constant current circuit 32 also includes, an N channel MOSFET 15d and 16d. Where the N channel MOSFET 15d forms a mirror pair with the N channel MOSFETs 15a to 15c, and the N channel MOSFET 16d forms a mirror pair with the N channel MOSFETs 16a to 16c.

The current carrying part of the switch circuit 28 is coupled to the power supply side constant current circuit 31 and the ground side constant current circuit 32. Specifically, the resistor element 29 of the current carrying part is coupled to the drain of P channel MOSFET 14b and to the drain of N channel MOSFET 16c, and the resistor element 30 of the current carrying part is coupled between the drain of the P channel MOSFET 14c and the drain of the N channel MOSFET 16d.

By employing the configuration of the third embodiment, similar to the first embodiment, when the control circuit 17 provides the constant current Iref for the ground side constant current circuit 32, the resistor elements 29, 30 of the current carrying part respectively have a mirror current Ig1 (≈Ic1), Ig2 (≈Ic2), and a gate potential of each of the P channel MOSFETs 8, 9 is lowered from a source potential, thereby tuning on (i.e., conducting) the switch circuit 28. Therefore, the same effects as the first embodiment are achieved.

Fourth Embodiment

Figure 5:
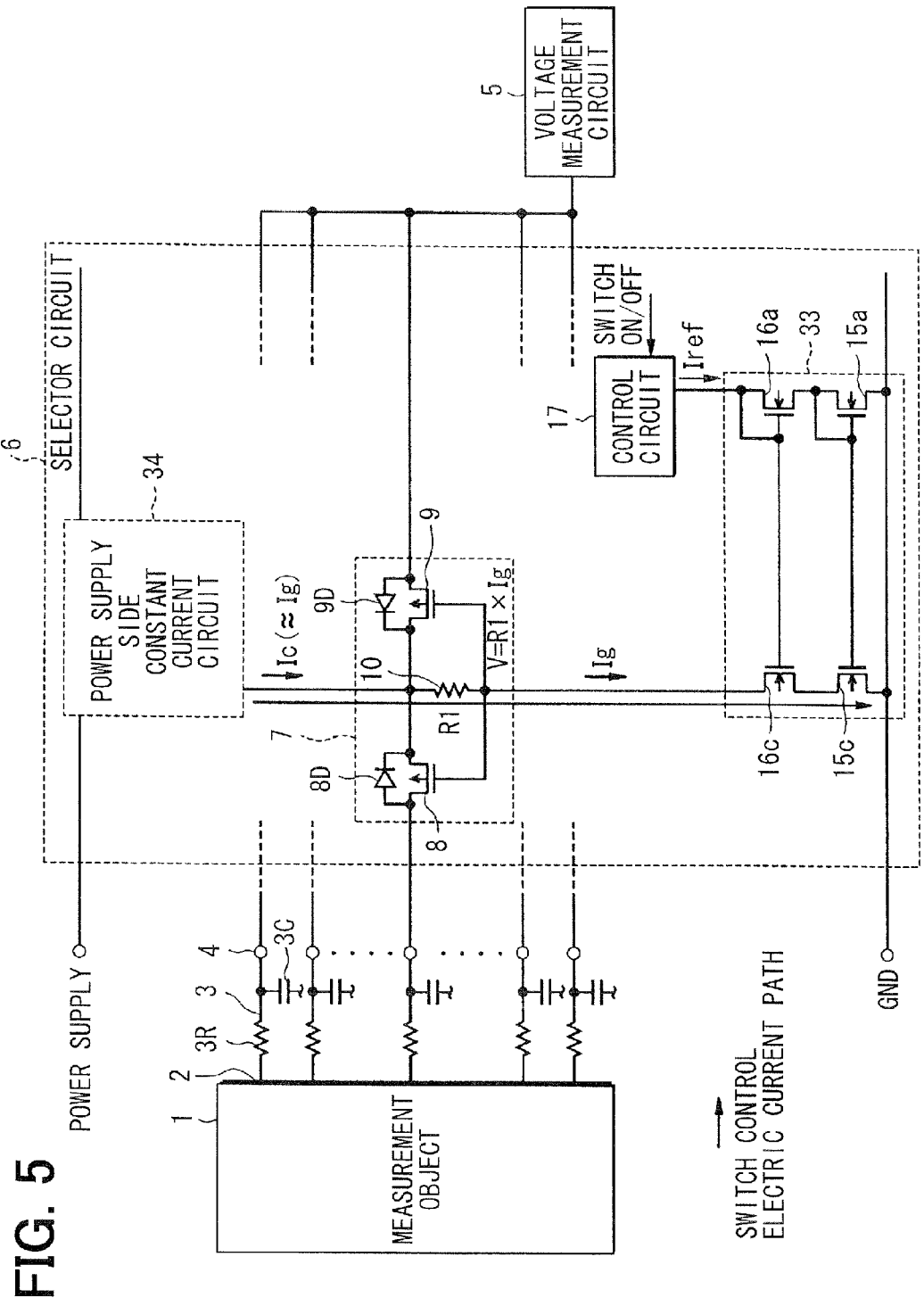
FIG. 5 is a schematic diagram of a voltage measurement apparatus in a fourth embodiment of the present disclosure.
Figure 6:
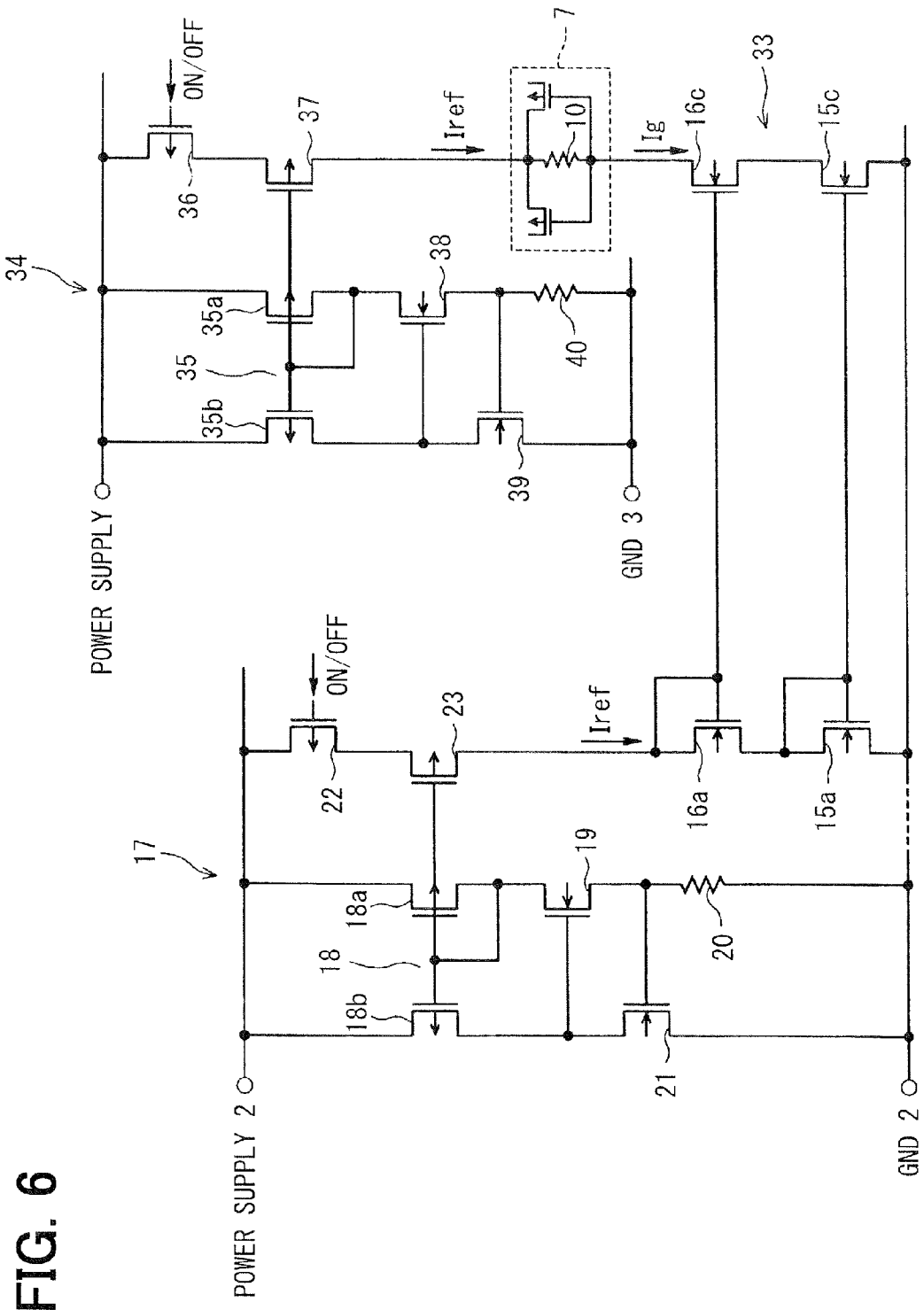
FIG. 6 is a detail of a control circuit in the fourth embodiment of the present disclosure.

FIGS. 5 and 6 show a configuration of the fourth embodiment, in which like parts have like numbers as the previous embodiments and the description in the following describes differences from the first embodiment. A ground side constant current circuit 33 of the fourth embodiment have the N channel MOSFETs 15b and 16b removed from the ground side constant current circuit 12. A power supply side constant current circuit 34 is arranged in place of the power supply side constant current circuit 11. As shown in FIG. 6, the power supply side constant current circuit 34 forms a self-bias type constant current circuit, which is similar to the control circuit 17 in the first embodiment, with the use of P channel MOSFETs 35a, 35b, 36, 37; N channel MOSFETs 38, 39; and a resistor element 40. A ground to which the source of the N channel MOSFET 39 and the resistor element 40 are coupled to is designated as a GND (3). Furthermore, the drain of the P channel MOSFET 37 is coupled to each of the sources of the P channel MOSFETs 8, 9 that form the switch circuit 7.

The constants and characteristics of each of the circuit elements forming the power supply side constant current circuit 34 are set to have the same configuration as each of the circuit elements in the control circuit 17. Further, an ON/OFF signal for the gate of the P channel MOSFET 36 is provided in synchronization with an ON/OFF signal to the gate of the P channel MOSFET 22 such that the constant current Iref through the P channel MOSFET 37 is provided for the power supply side constant current circuit 34 at the same time when the constant current Iref through the P channel MOSFET 23 is provided for the control circuit 17. Therefore, when the switch circuit 7 and the power supply side constant current circuit 34 are both operated the constant current Iref is provided to the current carrying part, the resistor element 10.

According to the configuration of the fourth embodiment, the ground side constant current circuit 33 is formed by the current mirror circuit having the N channel MOSFETs 15, 16. The control circuit 17 provides a constant current for a control current path (i.e., a drain of each of the N channel MOSFETs 15a, 16a) of such current mirror circuit. Further, the power supply side constant current circuit 34 cooperates with the control circuit 17 to provide the constant current Ic, which is same as the constant current Iref from the control circuit 17, to a mirror current path (i.e., the drain of each of the N channel MOSFETs 15c, 16c) of the above current mirror circuit. In such configuration, the resistor element 10 of the switch circuit 7 receives an electric current.

Further, in the fourth embodiment, a power supply and a ground of the control circuit 17 are separable from a power supply and a ground of the power supply side constant current circuit 34, which is different from and in contrast to the first embodiment. Therefore, each of the circuit elements may be smaller and may have a lower withstand voltage. Thus, the volume of the voltage measurement apparatus may be decreased.

Fifth Embodiment

Figure 7:
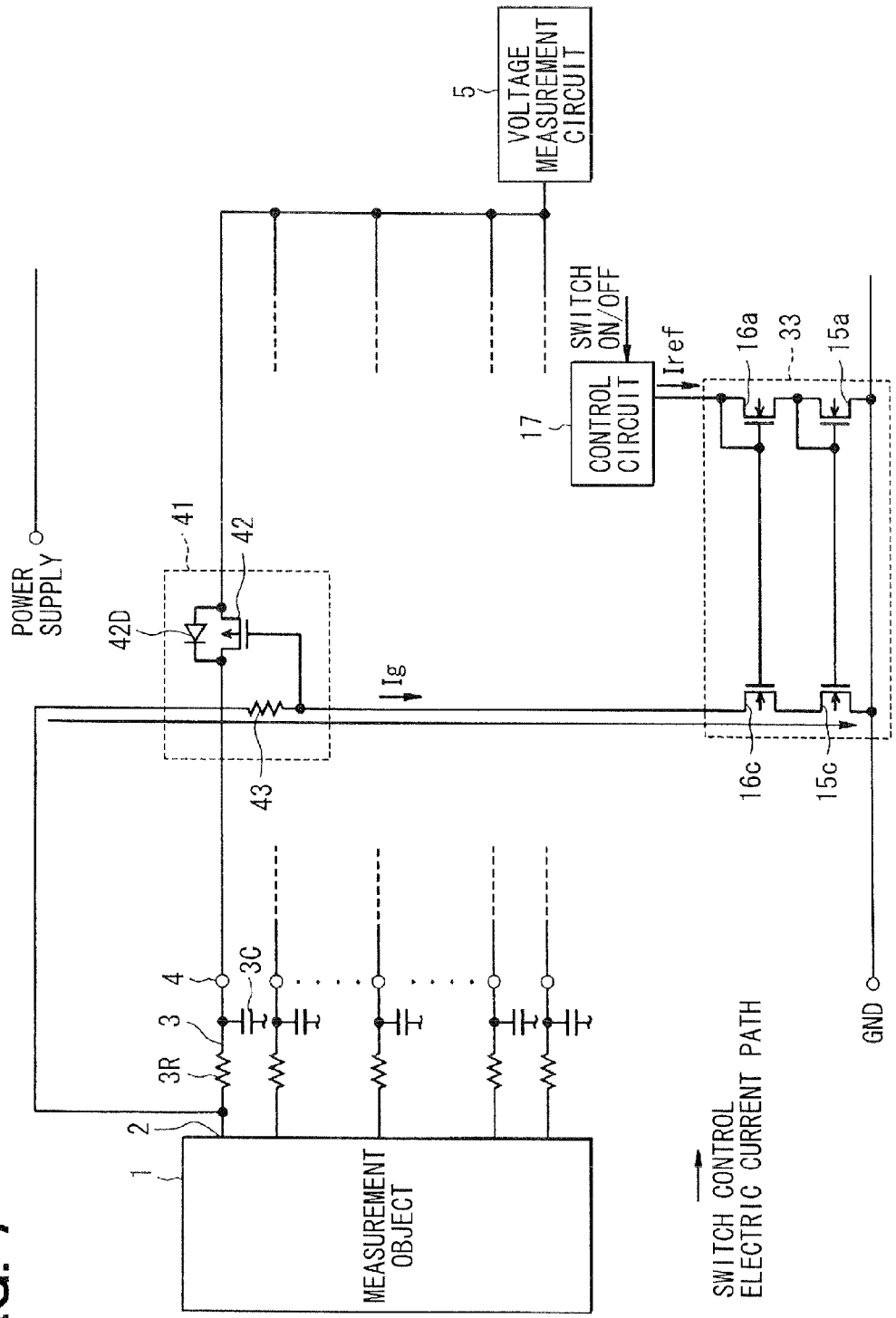
FIG. 7 is a schematic diagram of a voltage measurement apparatus in a fifth embodiment of the present disclosure.

The fifth embodiment is shown in FIG. 7 in which like parts have like numbers as the previous embodiments. In the fifth embodiment, a switch circuit 41 (i.e., a high potential switch circuit) is used to measure a potential of the voltage measurement point 2 having (a) an electric potential equal to or greater than a power supply voltage and (b) a highest electric potential among the multiple voltage measurement points 2 in the measurement object 1. For example, the measurement point 2 having the highest electric potential shown in FIG. 7 may have an electric potential that is equal to an electric potential of "a power supply" in FIG. 7. The switch circuit 41 is formed by a P channel MOSFET 42 and a current carrying part that is a resistor element 43. The source of the P channel MOSFET 42 is coupled to the point 4, and the drain of the P channel MOSFET 42 is coupled to the voltage measurement circuit 5. One end of the resistor element 43 is coupled to the voltage measurement point 2, and the other end of the resistor element 43 is coupled to the gate of the P channel MOSFET 42 and to the drain of the N channel MOSFET 16c of the ground side constant current circuit 33 of the fourth embodiment.

When the control circuit 17 provides the constant current Iref to operate the ground side constant current circuit 33, the mirror current Ig flows from the voltage measurement point 2 to the resistor element 43 of the switch circuit 41. Then, a voltage drop is caused by the resistor element 43, and a gate potential falls under a source potential, and the P channel MOSFET 42 is turned on. At such moment, an electric current for turning-on of the switch circuit 41 flows from the voltage measurement point 2, but not from the resistor element 3R of the low-pass filter 3, thereby not causing a voltage drop in the resistor element 3R, thereby having little or no influence. A situation described here, in which the voltage measurement circuit 5 has to measure the measurement object 1 that has a higher electric potential than the power supply voltage of its own, for example, may be handled without problem by internally dividing the voltage of the measurement object 1 into two or more parts, or by level-shifting the voltage to be measured.

According to the fifth embodiment, the switch circuit 41 is formed by the P channel MOSFET 42 that is coupled to the point 4 via the source, and the resistor element 43 coupled between the voltage measurement point 2 and the gate of the P channel MOSFET 42, together with the ground side constant current circuit 33 having a constant current path coupled to such gate. In other words, the switch circuit 41 may be formed by only one P channel MOSFET 42 in the fifth embodiment, because there is backward electric current that flows reversely through a parasitic diode 42D from a voltage measurement circuit 5 side toward the voltage measurement point 2.

Sixth Embodiment

Figure 8:
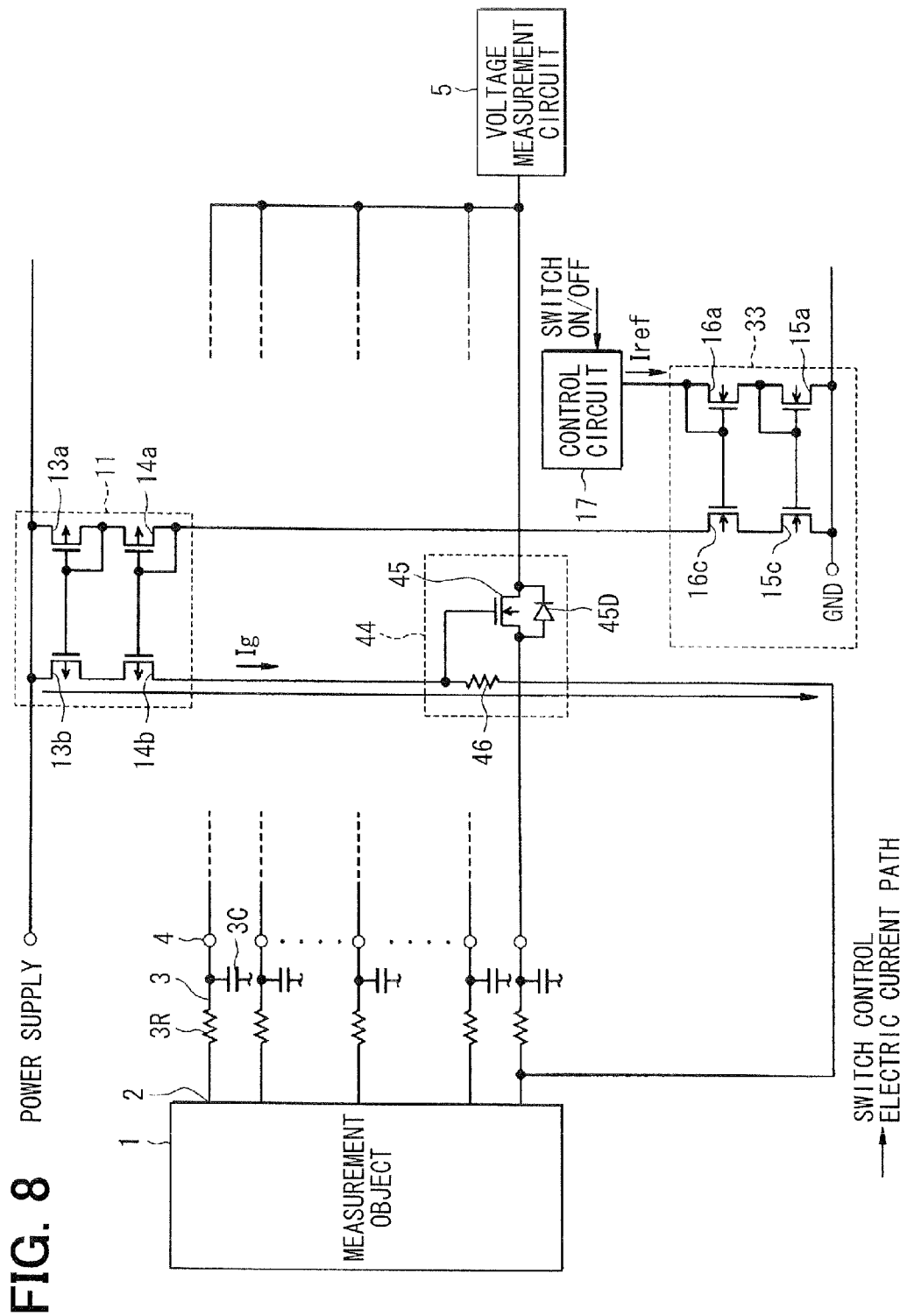
FIG. 8 is a schematic diagram of a voltage measurement apparatus in a sixth embodiment of the present disclosure.

The sixth embodiment is shown in FIG. 8 in which like parts have like numbers as the previous embodiments. In the sixth embodiment, a switch circuit 44 (i.e., a low potential switch circuit) is used to measure a potential of the voltage measurement point 2 having (a) an electric potential equal to or smaller than a ground voltage and (b) a lowest electric potential among the multiple voltage measurement points 2 in the measurement object 1. The switch circuit 44 is formed by an N channel MOSFET 45 and a current carrying part that is a resistor element 46. The source of the N channel MOSFET 45 is coupled to the point 4, and the drain of the N channel MOSFET 45 is coupled to the voltage measurement circuit 5. The electric potential of the voltage measurement point 2 having the lowest potential among the multiple voltage measurement points 2 shown in FIG. 8 may be, for example, a potential that is equal to "GND" in FIG. 8.

One end of the resistor element 46 is coupled to the drain of the N channel MOSFET 14b of the power supply side constant current circuit 11, in addition to the gate of the N channel MOSFET 45, and the other end of the resistor element 46 is coupled to the voltage measurement point 2. Further, the drain of the N channel MOSFET 14a is coupled to the drain of the N channel MOSFET 16c of the ground side constant current circuit 33 (i.e., a control circuit).

When the control circuit 17 provides the constant current Iref to operate the ground side constant current circuit 33, the power supply side constant current circuit 11 is also operated, and the mirror current Ig flows from the drain of the N channel MOSFET 14b (i.e., a constant current path) of the power supply side constant current circuit 11 to the resistor element 46 of the switch circuit 44. Then, a gate potential is raised to exceed a source potential to turn on the N channel MOSFET 45. In a situation, as described above, where the voltage measurement circuit 5 measures the measurement object 1 that has a lower electric potential than the ground potential of its own, for example, may be handled without problem by internally level-shifting the voltage of the measurement object, in a similar manner as described in the fifth embodiment.

According to the sixth embodiment, the switch circuit 44 is formed by the N channel MOSFET 45 having the drain coupled to the voltage measurement circuit 5, and the resistor element 46 having one end coupled to the constant current path of the power supply side constant current circuit 11 and the gate of the N channel MOSFET 45, and the other end coupled to the voltage measurement point 2. In other words, because there is no backward electric current that flows reversely through a parasitic diode 45D from the voltage measurement circuit 5 side toward the voltage measurement point 2, the switch circuit 44 may be formed by only one N channel MOSFET 45.

Seventh Embodiment

Figure 9:
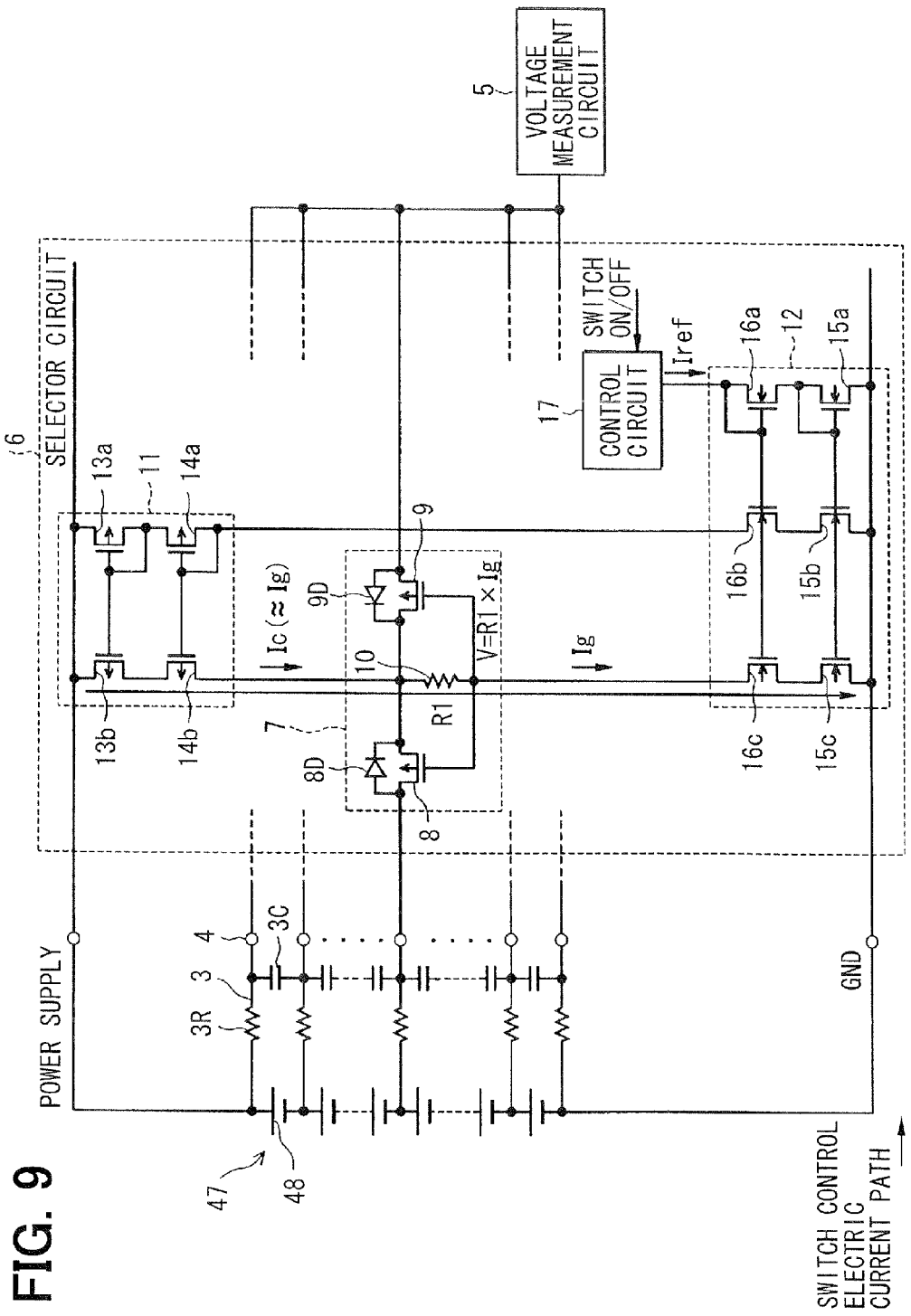
FIG. 9 is a schematic diagram of a voltage measurement apparatus in a seventh embodiment of the present disclosure.

The seventh embodiment is shown in FIG. 9, in which like parts have like numbers as the previous embodiments, and an object of voltage measurement is an assembled battery 47. The assembled battery 47 has multiple unit cells 48 coupled in series, and a positive side terminal of each of the multiple unit cells 48 and a negative side terminal of the lower-most unit cell 48 may respectively correspond to the voltage measurement point 2 in the first embodiment. In this case, the capacitor 3C of the low-pass filter 3 is coupled between the positive side terminal and the negative side terminal of each unit cell 2.

According to the seventh embodiment, the voltage measurement object is an electric potential of each terminal in each of the multiple unit cells 48 in the assembled battery 47 as described above. In other words, in contrast to the conventional technique in which the electric power of the unit cell 48, which is to be measured as the voltage measurement object, is consumed while the switch circuit 7 is conducted, the voltage measurement in the seventh embodiment does not consume the electric power of the unit cell 48, thereby preventing the voltage variations among the multiple unit cells 48.

Eighth Embodiment

Figure 10:
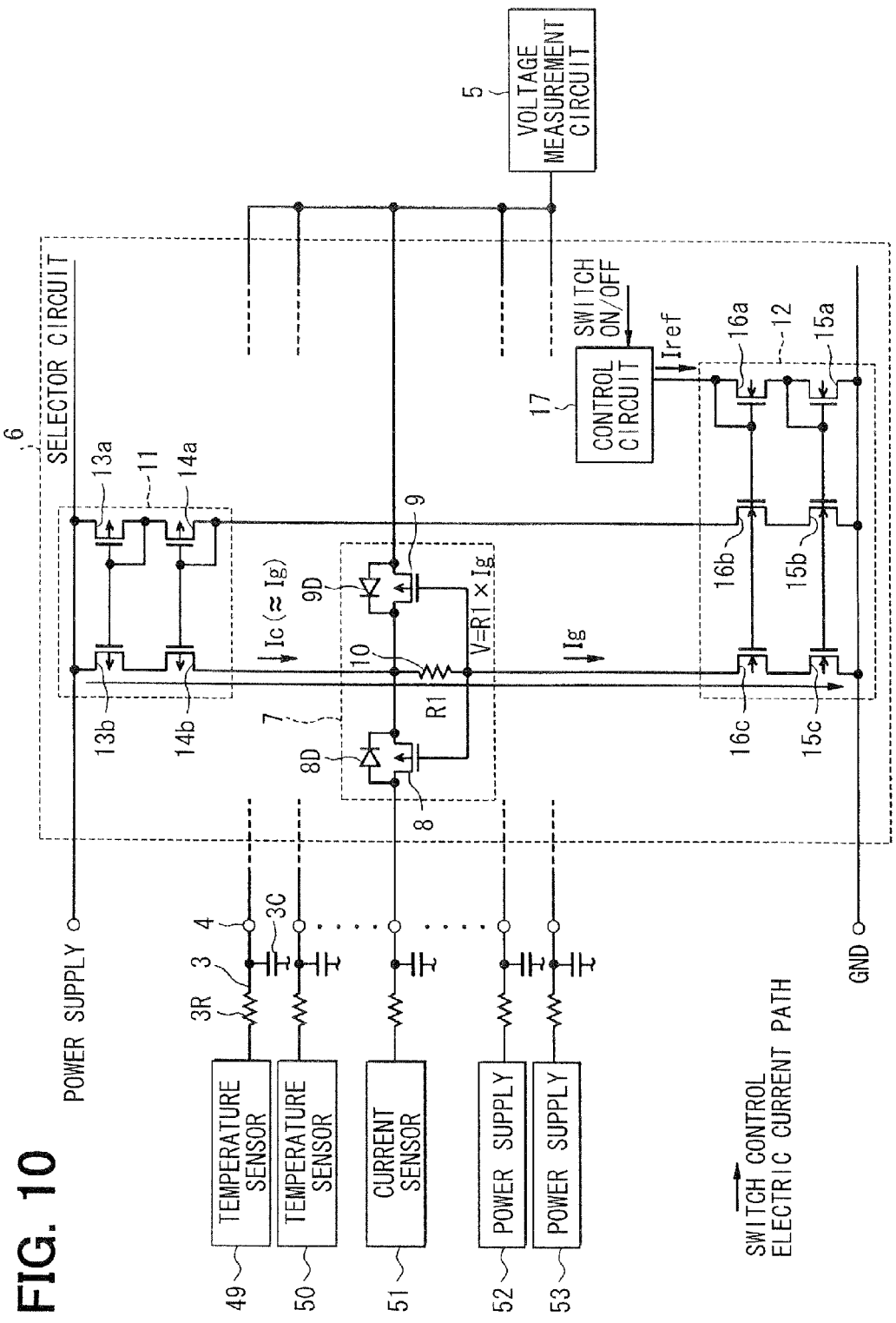
FIG. 10 is a schematic diagram of a voltage measurement apparatus in an eighth embodiment of the present disclosure.

The eighth embodiment is shown in FIG. 10, in which like parts have like numbers as the previous embodiments, and an object of the voltage measurement is multiple sensors, or the like. For example, output terminals of the sensor signal (i.e., a voltage signal) in temperature sensors 49, 50 and a current sensor 51 as well as power supply terminals of power supplies 52, 53 may respectively correspond to the voltage measurement point 2 of the first embodiment. The power supplies 52, 53 may be same as a power supply for the voltage measurement circuit 5 and the selector circuit 6, or may be different from such power supply.

Ninth Embodiment

Figure 11:
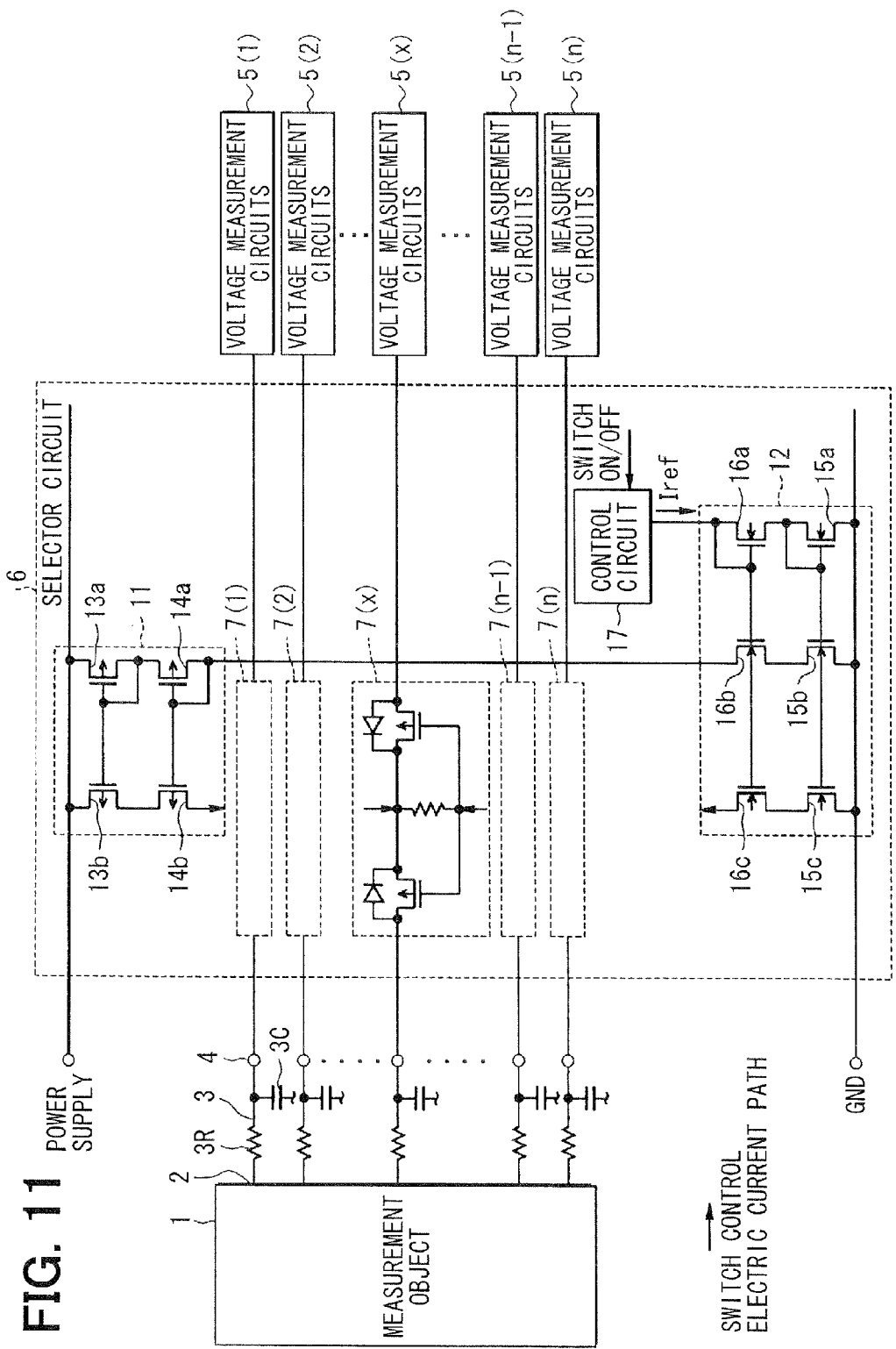
FIG. 11 is a schematic diagram of a voltage measurement apparatus in a ninth embodiment of the present disclosure.

The ninth embodiment is shown in FIG. 11, in which like parts have like numbers as the previous embodiments, and the voltage measurement circuit 5 is provided for each measurement terminal 4, that is, the switch circuit 7 corresponds one-to-one with the voltage measurement circuit 5 (i.e., n pairs of the switch circuit 7 and the voltage measurement circuit 5 are formed).

Tenth Embodiment

Figure 12:
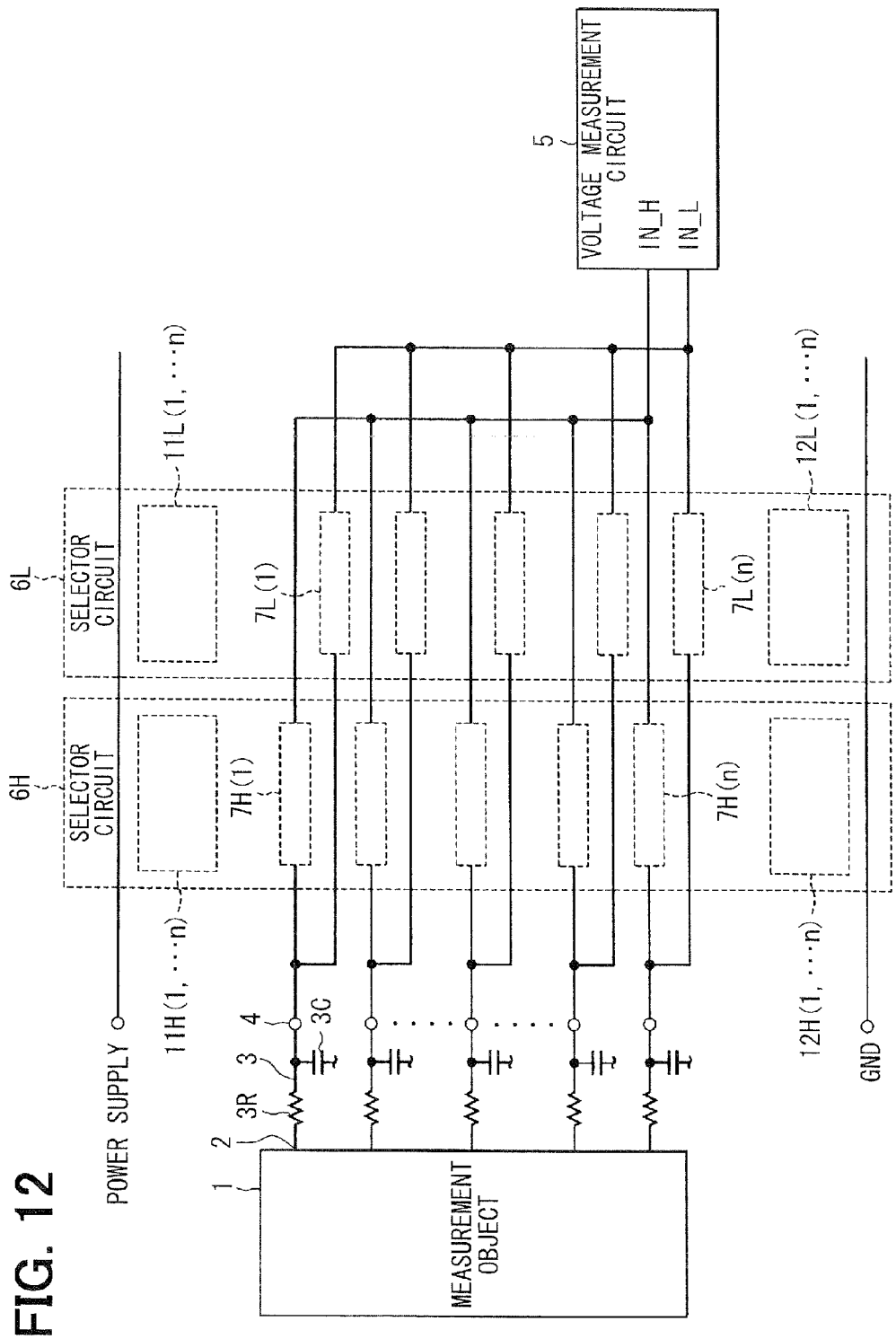
FIG. 12 is a schematic diagram of a voltage measurement apparatus in a tenth embodiment of the present disclosure.

FIG. 12 is used to explain the tenth embodiment, in which like parts have like numbers as the previous embodiments, and a difference in voltage between two adjacent voltage measurement points 2 in the measurement object 1 is measured by the voltage measurement circuit 5. The selector circuit 6 are provided as two circuit groups (i.e., 6H, 6L), and each of the measurement terminals 4 has a connection to one end of a corresponding switch circuit 7H of the selector circuit 6H in common with one end of a corresponding switch circuit 7L of the selector circuit 6L. The other ends of the switch circuits 7H of the selection circuit 6H are coupled to an input terminal IN_H of the voltage measurement circuit 5 in common with each other, and the other ends of the switch circuits 7L of the selection circuit 6L are coupled to an input terminal IN_L of the voltage measurement circuit 5 in common with each other.

Though not shown in the drawing, the control circuit 17 is provided for each of the selector circuits 6H, 6L. By selective turning-on of one circuit in each of the switch circuits 7H, 7L respectively grouped as the selector circuits 6H and 6L, a difference voltage between any two voltage measurement points 2 is measured. In this case, if the difference voltage is not going to be measured in a manner that uses the highest potential of the measurement object 1 as a low potential side reference voltage, the switch circuit 7L (1) that corresponds to the voltage measurement point 2 of the highest potential is not required. Further, if the difference voltage is not going to be measured in a manner that uses the lowest potential of the measurement object 1 as a high potential side reference voltage, the switch circuit 7H (1) that corresponds to the voltage measurement point 2 of the lowest potential is not required.

According to the tenth embodiment, by switching ON/OFF of the corresponding switch circuits 7H, 7L of the selector circuits 6H, 6L, the difference voltage between any two voltage measurement points 2 of the measurement object is measured by the voltage measurement circuit 5.

Eleventh Embodiment

Figure 13:
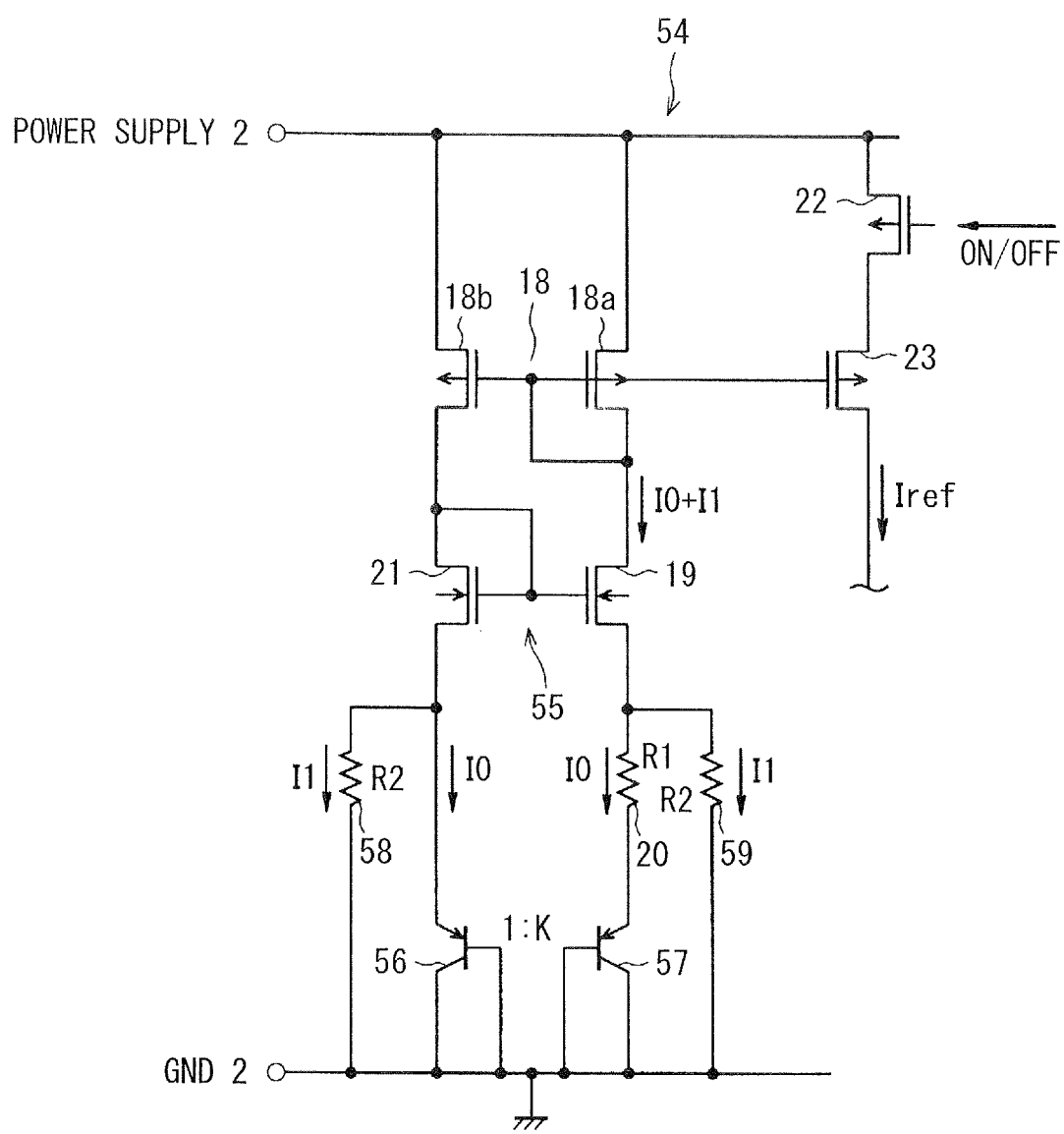
FIG. 13 is a detail of a control circuit in an eleventh embodiment of the present disclosure.

FIG. 13 shows a configuration of the eleventh embodiment, in which like parts have like numbers as the previous embodiments, and the configuration of the control circuit 17 of the first embodiment shown in FIG. 2 is modified to have a different constant current circuit. In a constant current circuit 54, a current mirror circuit 55 is formed by the N channel MOSFETs 19, 21 when the gate of each of the MOSFETs 19, 21 is coupled to a drain side of the N channel MOSFET 21. A collector and a base of two PNP transistors 56, 57, which may have an emitter ratio of 1:K, are coupled to a ground. The emitter of the PNP transistor 56 is coupled to the source of the N channel MOSFET 21, and the emitter of the PNP transistor 57 is coupled to the source of the N channel MOSFET 19 through the resistor element 20. Further, between the emitter and the collector of the PNP transistors 56, 57, resistor elements 58, 59 having the same resistance value (R2) are respectively coupled.

According to the above-described configuration of the constant current circuit 54, when it is assumed that an electric current I0 flows to the emitter of each of the PNP transistors 56, 57 and an electric current I1 flows to each of the resistor elements 58, 59, an electric current (I0+I1) flows to a drain of the P channel MOSFET 18a. When the resistor element 20 has a resistance value R1, and the N channel MOSFET 19 has a threshold voltage Vth, the electric current (I0+I1) is represented by an equation 1.

$$(I0+I1)=V\text{th}\cdot\ln(K)/R1 \qquad \text{(Equation 1)}$$

Further, the electric current I1 is in proportion to an absolute temperature, and the electric current I1 has a negative temperature coefficient. Therefore, a constant current Iref (≈I0+I1) that is free from temperature influence is provided by controlling a ratio between the electric currents I0 and I1 through the adjustment of the resistance values R1, R2.

Although the present disclosure has been fully described in connection with preferred embodiment thereof with reference to the accompanying drawings, it is to be noted that various changes and modifications will become apparent to those skilled in the art.

For example, the low-pass filter 3 may be used when it is necessary.

The switch circuit may be formed by the N channel MOSFETs coupled with a common drain.

The current mirror circuit may not necessarily be a cascode type circuit. That is, the current mirror circuit may be different circuit types. For example, the mirror circuit may have only one mirror pair, depending on the required accuracy of the electric current.

Such changes, modifications, and summarized schemes are to be understood as being within the scope of the present disclosure as defined by appended claims.

What is claimed is:

1. A voltage measurement apparatus for detecting plural voltage measurement points of a voltage measurement object by using a voltage measurement circuit, the apparatus comprising:
a switch circuit coupled between each of the plural voltage measurement points and the voltage measurement circuit, the switch circuit is turned on and off by an electric current flowing in a current carrying part of the switch circuit;

a power supply side constant current circuit coupled to a power supply side;

a ground side constant current circuit coupled to a ground side to draw a constant current that is similar to a constant current provided by the power supply side constant current circuit;

a control circuit that controls the operation of the power supply side constant current circuit and the ground side constant current circuit, wherein the current carrying part of the switch circuit is coupled to a constant current path that allows the constant current to flow between the power supply side constant current circuit and the ground side constant current circuit, and the current carrying part turns the switch circuit on and off through the control circuit.

2. The voltage measurement apparatus of claim 1, wherein the switch circuit includes a series connection of two same channel type MOSFETs with oppositely-arranged parasitic diodes coupled thereto, the diodes being coupled to the constant current path through a common cathode connection, and the current carrying part of the switch circuit is a resistor element that is coupled between a gate and a source of the MOSFETs and to the constant current path.

3. The voltage measurement apparatus of claim 2, wherein the two MOSFETs are a P channel MOSFET.

4. The voltage measurement apparatus of claim 2, wherein the two MOSFETs are in a common drain connection.

5. The voltage measurement apparatus of claim 2, wherein the two MOSFETs are a N channel MOSEET.

6. The voltage measurement apparatus of claim 2, wherein the two MOSFETs are in a common source connection.

7. The voltage measurement apparatus of claim 1, wherein the voltage measurement object is a terminal voltage of plural unit cells of an assembled battery.

8. The voltage measurement apparatus of claim 1, wherein the voltage measurement of plural voltage measurement points is performed by one voltage measurement circuit.

9. The voltage measurement apparatus of claim 1, further comprising:

a high potential switch circuit that includes a P channel MOSFET with its source coupled to the voltage measurement point, and a resistor element coupled between the voltage measurement point and a gate of the P channel MOSFET, and the high potential switch circuit is coupled between the voltage measurement circuit and the voltage measurement point whose potential is highest among the plural voltage measurement points and is equal to or greater than a power source potential, the ground side constant current circuit includes a constant current path coupled to the gate of the P channel MOSFET, and the control circuit operates the ground side constant current circuit, wherein the control circuit is used to switch on and off the high potential switch circuit.

10. The voltage measurement apparatus of claim 1, further comprising:

a low potential switch circuit that includes an N channel MOSFET with its source coupled to the voltage measurement point and a resistor element coupled between the voltage measurement point and a gate of the N channel MOSFET, and the low potential switch circuit is coupled between voltage measurement circuit and the voltage measurement point whose potential is lowest among the plural voltage measurement points and is smaller than a power source potential, the power supply side constant current circuit includes a constant current path coupled to the gate of the N channel MOSFET, and the control circuit controls operation of the power supply side constant current circuit, wherein the control circuit is used to switch the low potential switch circuit on and off.

11. The voltage measurement apparatus of claim 1, wherein the power supply side constant current circuit and the ground side constant current circuit are respectively formed as a current mirror circuit, and the control circuit is formed as a circuit that provides the constant current for the operation of the power supply side constant current circuit and the ground side constant current circuit.

12. The voltage measurement apparatus of claim 1, wherein the ground side constant current circuit is formed as a current mirror circuit, the control circuit is formed as a circuit that provides a constant current to a control current path of the current mirror circuit, and the power supply side constant current circuit cooperates with the control circuit to provide the constant current to the mirror current path of the current mirror circuit, an amount of the constant current provided by the power supply side constant current circuit is same as an amount of the constant current provided by the control circuit.

* * * * *